(12) United States Patent
Sun et al.

(10) Patent No.: US 11,322,606 B2
(45) Date of Patent: May 3, 2022

(54) HETEROJUNCTION SEMICONDUCTOR DEVICE HAVING HIGH BLOCKING CAPABILITY

(71) Applicant: SOUTHEAST UNIVERSITY, Nanjing (CN)

(72) Inventors: Weifeng Sun, Nanjing (CN); Siyang Liu, Nanjing (CN); Sheng Li, Nanjing (CN); Chi Zhang, Nanjing (CN); Xinyi Tao, Nanjing (CN); Ningbo Li, Nanjing (CN); Longxing Shi, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 160 days.

(21) Appl. No.: 16/969,437

(22) PCT Filed: Oct. 21, 2019

(86) PCT No.: PCT/CN2019/112099
§ 371 (c)(1),
(2) Date: Aug. 12, 2020

(87) PCT Pub. No.: WO2020/192098
PCT Pub. Date: Oct. 1, 2020

(65) Prior Publication Data
US 2021/0234030 A1    Jul. 29, 2021

(30) Foreign Application Priority Data
Mar. 27, 2019 (CN) .......................... 201910240465.7

(51) Int. Cl.
*H01L 29/778* (2006.01)

(52) U.S. Cl.
CPC ................................ *H01L 29/7787* (2013.01)

(58) Field of Classification Search
None
See application file for complete search history.

(56) References Cited

U.S. PATENT DOCUMENTS

2009/0267078 A1 * 10/2009 Mishra ................ H01L 21/0254
257/E21.403

* cited by examiner

*Primary Examiner* — Jack S Chen
(74) *Attorney, Agent, or Firm* — CBM Patent Consulting, LLC

(57) ABSTRACT

A heterojunction semiconductor device comprises a substrate; a second barrier layer is disposed on the second channel layer and a second channel is formed; a trench gate structure is disposed in the second barrier layer; the trench gate structure is embedded into the second barrier layer and is composed of a gate medium and a gate metal located in the gate medium; an isolation layer is disposed in the second channel layer and separates the second channel layer into an upper layer and a lower layer; a first barrier layer is disposed between the lower layer of the second channel layer and the first channel layer and a first channel is formed; a bottom of the metal drain is flush with a bottom of the first barrier layer; and a first metal source is disposed between the second metal source and the first channel layer.

5 Claims, 3 Drawing Sheets

HETEROJUNCTION SEMICONDUCTOR DEVICE HAVING HIGH BLOCKING CAPABILITY

TECHNICAL FIELD

The present invention belongs to the field of power electronic systems and semiconductor devices, and in particular to a heterojunction semiconductor device having a high blocking capability.

BACKGROUND

As a typical compound semiconductor, the gallium nitride (GaN)-based III-V group compound semiconductor has become one of the most promising third generation of semiconductors. The GaN possesses many excellent electrical characteristics such as large bandgap, high thermal conductivity, high temperature resistance, radiation resistance, acid and alkali resistance, high strength and high hardness, and has huge application prospects in high-temperature and high-power electronic devices, high-frequency devices, photodetectors, etc.

At present, increasing more GaN devices are applied to power electronic systems having bridge circuit structures or LLC resonance circuits. In these applications, it is inevitable for the GaN devices to work in a reverse conducting state. FIG. 1 illustrates a structure of a conventional GaN metal-insulator-semiconductor (MIS) high electron mobility transistor (HEMT) device, which includes: a substrate, a channel layer, a barrier layer, a drain metal on one side of an upper surface of the barrier layer, a source metal on the other side of the upper surface of the barrier layer, an insulating layer in the middle of the upper surface of the barrier layer and a gate metal.

In the reverse conducting state, the reverse conducting voltage of the ordinary metal oxide semiconductor (MOS) device is the conducting voltage drop on the body diode. In contrast, as the reverse conducting voltage drop of the conventional GaN HEMT device is controlled by the gate voltage, the reverse voltage drop ($V_R$) is high to cause high energy loss and low efficiency. There are mainly two common improvement methods for the conventional GaN HEMT device. The first method is to connect a Schottky diode in parallel via an external circuit. However, in this case, the switching speed of the device is greatly limited, and the parasitic capacitance is also increased due to the external parallel connected device, such that the advantages of fast switching speed and low loss of the original GaN device cannot be put into full play. The second method is a process integration method, and is to integrate a Schottky diode structure to the GaN HEMT device in the horizontal direction by the use of the complementary metal oxide semiconductor (CMOS) process. With such a method, the off-state leakage current of the device is large, the device is prone to breakdown and thus the working requirements are no longer met; and the method also makes the utilization rate for the area of the wafer low, the cost increased and the process steps more difficult. Therefore, without compromising a series of positive capabilities of the GaN HEMT device such as the switching speed, to improve the breakdown voltage and overall current freewheeling capability of the device becomes the problem to be solved urgently.

SUMMARY

In view of the above problems, the present invention provides a heterojunction semiconductor device which is able to ensure the high blocking capability with the forward conducting capability.

The technical solutions used by the present invention as follows:

A heterojunction semiconductor device having a high blocking capability includes: a substrate; a first channel layer is disposed on the substrate; a second channel layer, a metal drain and a second metal source are arranged on the first channel layer; a second barrier layer is disposed on the second channel layer and a second channel is formed; the metal drain and the second metal source are respectively located on two sides of the second channel layer and the second barrier layer; a trench gate structure is disposed in the second barrier layer; the trench gate structure is embedded into the second barrier layer and is composed of a gate medium and a gate metal located in the gate medium; an isolation layer is disposed in the second channel layer and separates the second channel layer into an upper layer and a lower layer; a first barrier layer is disposed between the lower layer of the second channel layer and the first channel layer and a first channel is formed; a bottom of the metal drain is flush with a bottom of the first barrier layer; and a first metal source is disposed between the second metal source and the first channel layer.

Further, the first metal source is in Schottky contact with the first channel, and the second metal source is in ohmic contact with the second channel.

Further, a distance from a bottom of the isolation layer to a top of the first barrier layer is not less than 0.1 µm.

Further, a group of channel layer and barrier layer that are laminated to each other is at least disposed between the lower layer of the second channel layer and the first barrier layer, and a current channel is formed between the channel layer and the barrier layer.

Further, the current channel between the channel layer and barrier layer that are laminated to each other is in Schottky contact with the first metal source.

Compared with the existing devices, the present invention has the following advantages:

In the present invention, the integrated first channel is vertically located below the second channel, and the first channel can take the assisted depletion effect, such that the overall breakdown voltage of the device can be improved, the leakage current is reduced and the reliability of the device is enhanced. At the meantime, the present invention has the high voltage blocking performance and the low reverse voltage drop, and thus can be widely applied to the fields of high powers, high frequencies and microwaves. When the device is applied to the inductive load circuit and is in the reverse conducting state, in case of the large reverse current of the circuit, the reverse current in the inductive load is discharged by the internal first channel at the moment of turn-off, thereby protecting the safety of the device and the whole circuit, and improving the stability of the device and the circuit; and therefore, the heterojunction semiconductor device has a variety of applications in the inductive load circuit and other environments.

(1) The blocking capability of the device is improved. When the conventional semiconductor device transversely integrated with the Schottky diode structure works in the reverse blocking state at a zero gate-source voltage or a negative gate-source voltage and a high drain voltage, the voltage reverse-biased state is formed between the drain and the gate, and the two-dimensional electron gas, close to the drain electrode region, on the bottom of the gate is depleted to form the space-charge region; with the increase of the drain voltage, the space-charge region expands continuously and thus the device has the blocking capability. Nevertheless, a part of channel electrons between the gate and the source reach the drain electrode downward along the depletion region to form the off-state leakage current. Consequently, when the drain voltage continues to increase, the leakage current increases therewith and the device no longer meets the blocking requirements. In the structure provided by the present invention, the Schottky contact capable of depleting the electrons is formed between the first source metal and the first channel. At this time, an initial space-charge region is in the vicinity of the first source, such that the two-dimensional electron gas close to the source region and under the gate is reduced. With the increase of the drain voltage, the space-charge region in the vicinity of the first source further expands to be under the gate, the two-dimensional electron gas close to the source region and under the gate is further reduced, and the electrons reaching to the drain are also reduced, thereby effectively suppressing the off-state leakage current. Therefore, the device greatly reduces the overall off-state leakage current, and improves the blocking capability. Compared with the semiconductor device transversely integrated with the Schottky diode, the device of the present invention has a larger space-charge region, a smaller leakage current, a higher breakdown voltage and stronger reliability in the off state.

(2) The reverse turn-on voltage is reduced. As the first channel is vertically located below the second channel, the first source metal is in the Schottky contact, the second source metal is in the ohmic contact, and the work function forming the Schottky contact is greater than that of the ohmic contact, the first channel has the lower conducting voltage drop to reduce the reverse turn-on voltage.

(3) The current freewheeling capability is enhanced. The integrated first channel may use the structure having multiple channel layers and barrier layers to form multiple two-dimensional electron gas channels. In the reverse conducting work state, as illustrated in the simulation result of the reverse characteristic curve between the heterojunction semiconductor device having the high current freewheeling capability and the conventional GaN MIS HEMT device in FIG. 4, the device of the present invention has the lower reverse turn-on voltage than the conventional device. Because of the multiple two-dimensional electron gas channels, the multiple two-dimensional electron gas channels enhance the current discharge capability and reduce the reverse on-resistance in the reverse conducting work state, thereby further improving the stability of the device and the circuit.

(4) The transverse area of the device is reduced. In the comparison with the conventional device transversely integrated with the Schottky diode, the conventional device has the large transverse area due to the transversely integrated Schottky diode, both the on-resistance and the parasitic capacitance are also increased, and at last the advantages of fast switching speed and low loss of the GaN HEMT device cannot be put into full play. In the present invention, since the first channel is vertically located below the second channel, the integration level is improved, the transverse area is small, and the on-resistance may further be reduced.

(5) The process compatibility is high. Both the second channel structure and the first channel structure are simultaneously produced on the same wafer, and the additional CMOS process turns out to be unnecessary in the production of the first channel structure.

DETAILED DESCRIPTION

Figure 1:
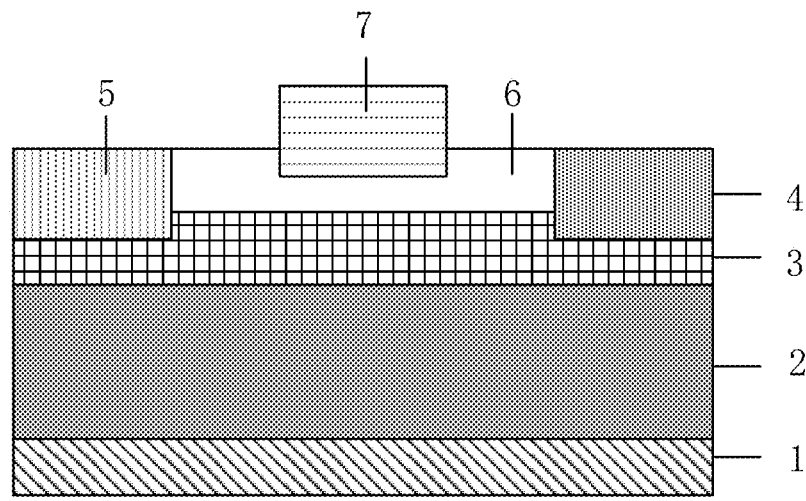
FIG. 1 is a structural diagram of a conventional GaN MIS HEMT device.
Figure 2:
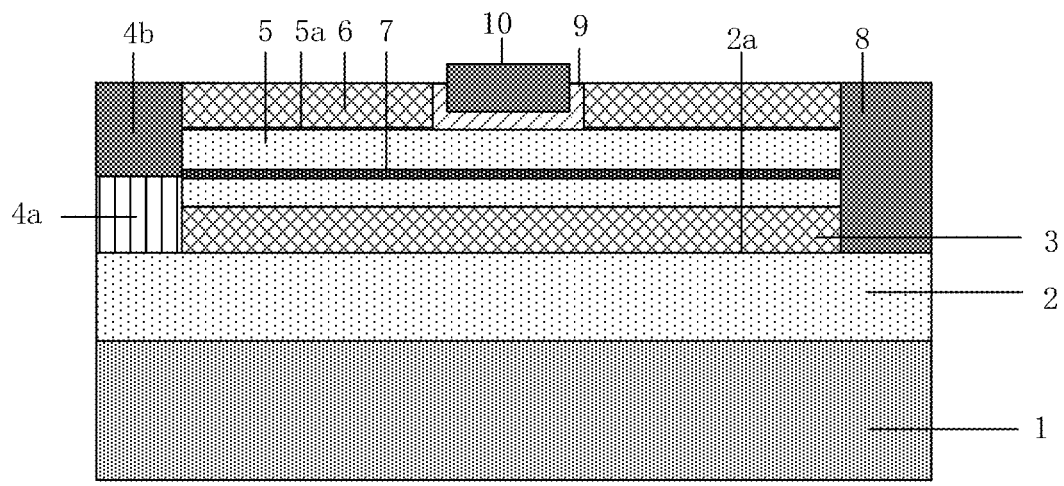
FIG. 2 is a structural diagram of a heterojunction semiconductor device having a high blocking capability according to the present invention.
Figure 3:
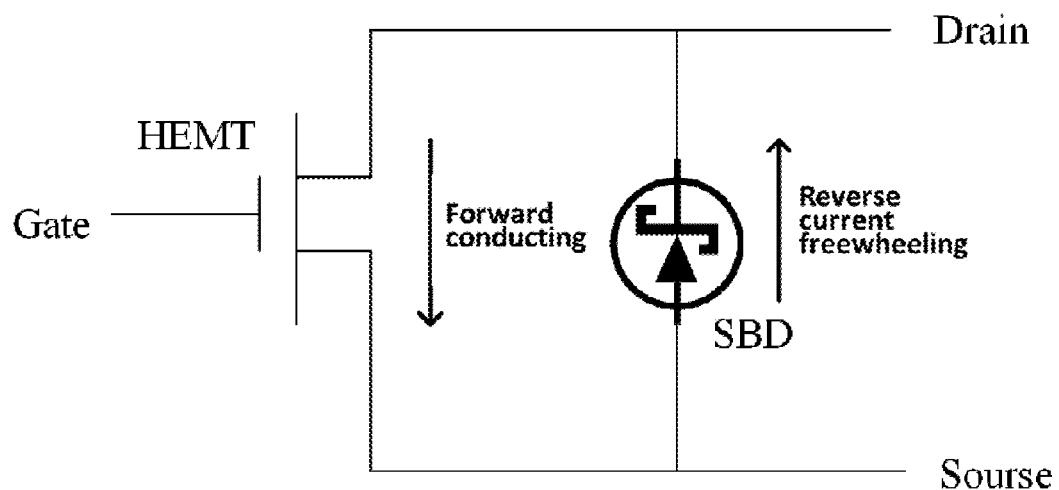
FIG. 3 is an equivalent circuit diagram of a heterojunction semiconductor device having a high blocking capability according to the present invention.
Figure 4:
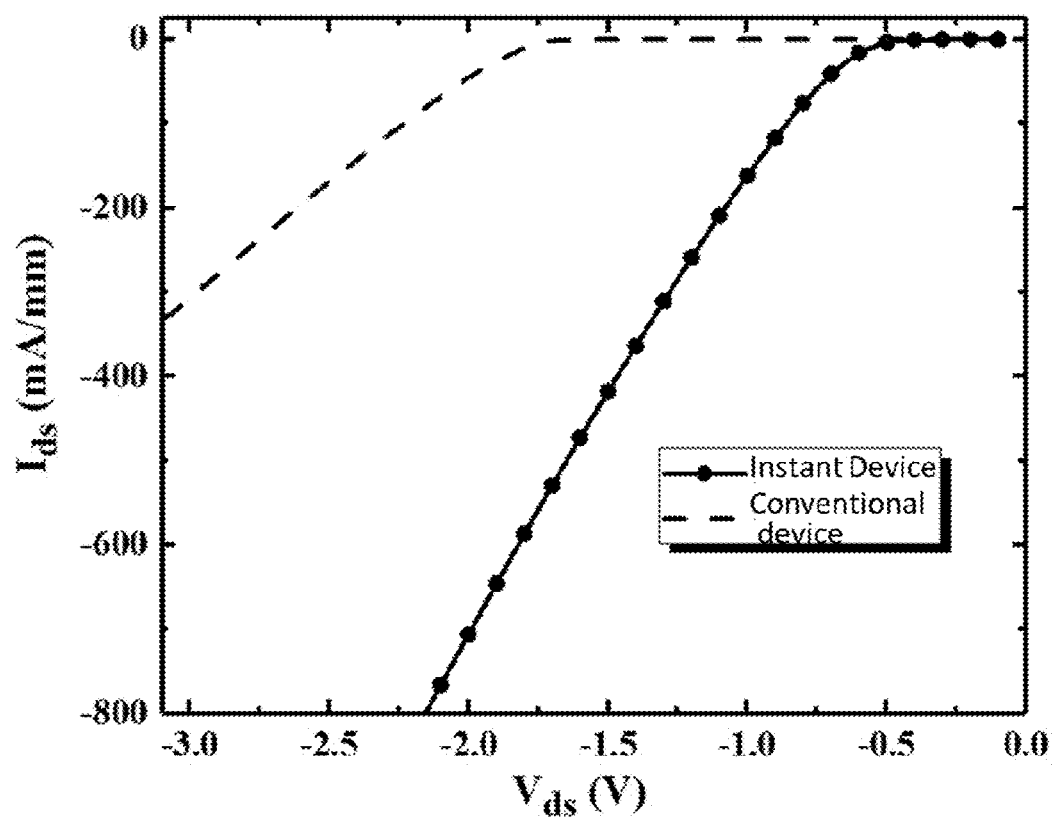
FIG. 4 is a simulation result of a reverse characteristic curve between a heterojunction semiconductor device having a high blocking capability and a conventional GaN HEMT device according to the present invention, in which it can be seen that the device of the present invention reduces an on resistance and enhances a current transport capability.
Figure 5:
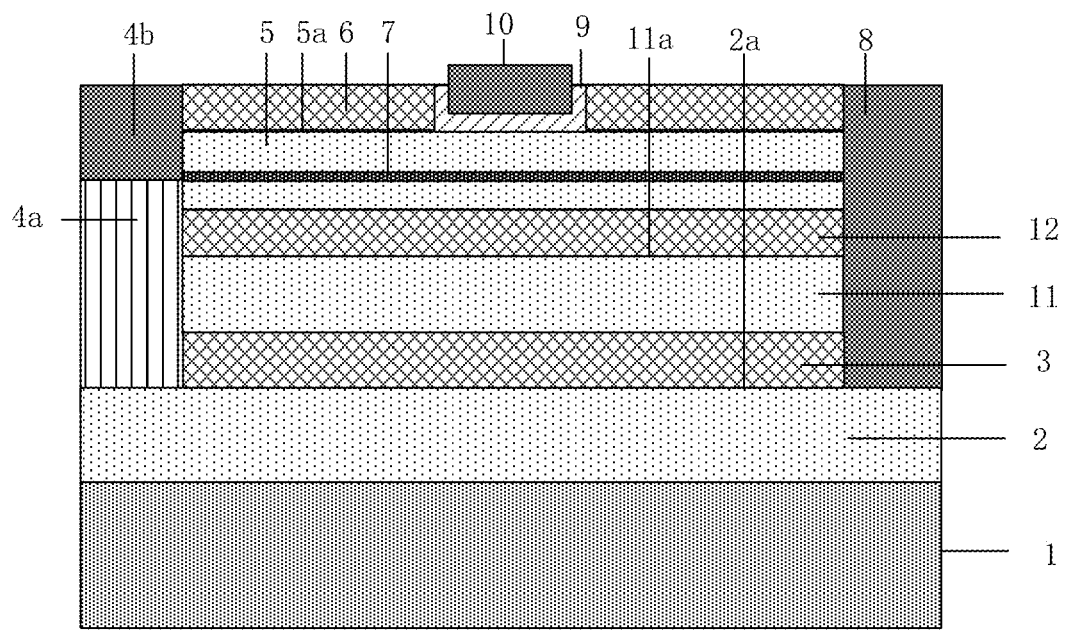
FIG. 5 is a structural schematic diagram of a heterojunction semiconductor device including multiple current channels and having a high blocking capability according to an embodiment.
Figure 6:
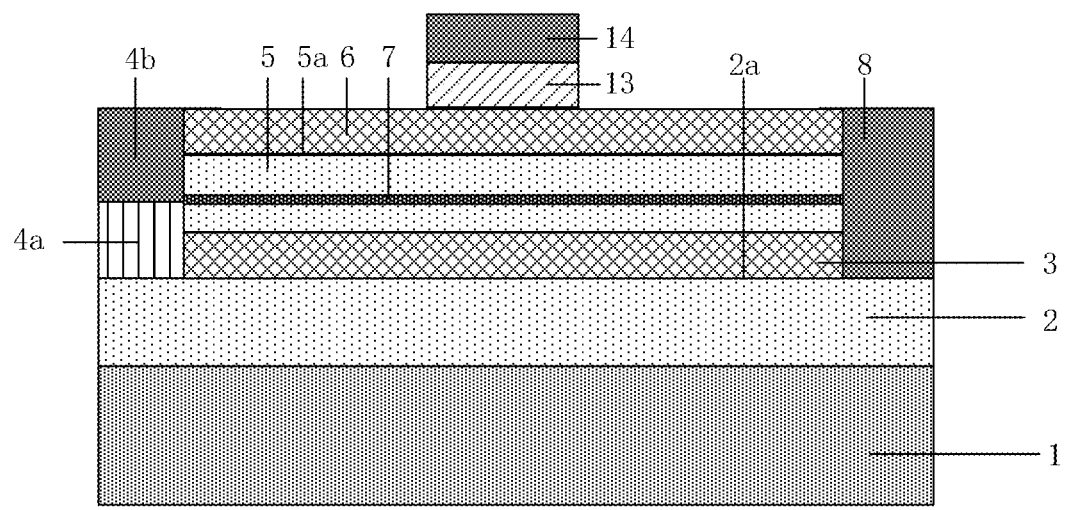
FIG. 6 is a structural schematic diagram of a heterojunction semiconductor device including a gate structure with a p-type GaN cap layer and having a high blocking capability according to an embodiment.

A heterojunction semiconductor device having a high blocking capability includes: a substrate 1; a first channel layer 2 is disposed on the substrate 1; a second channel layer 5, a metal drain 8 and a second metal source 4b are arranged on the first channel layer 2; a second barrier layer 6 is disposed on the second channel layer 5 and a second channel 5a is formed; the metal drain 8 and the second metal source 4b are respectively located on two sides of the second channel layer 5 and the second barrier layer 6; a trench gate structure is disposed in the second barrier layer 6; the trench gate structure is embedded into the second barrier layer 6 and is composed of a gate medium 9 and a gate metal 10 located in the gate medium 9; an isolation layer 7 is disposed in the second channel layer 5 and separates the second channel layer 5 into an upper layer and a lower layer; a first barrier layer 3 is disposed between the lower layer of the second channel layer 5 and the first channel layer 2 and a first channel 2a is formed; a bottom of the metal drain 8 is flush with a bottom of the first harrier layer 3; a first metal source 4a is disposed between the second metal source 4b and the first channel layer 2; the first metal source 4a is in Schottky contact with the first channel 2a; and the second metal source 4b is in ohmic contact with the second channel 5a.

The heterojunction semiconductor device may further include the following manners:

(1) Multiple groups of channel layers and barrier layers that are laminated to each other are disposed between the lower layer of the second channel layer 5 and the first barrier layer 3, multiple current channels are formed between the channel layers and the barrier layers, and each current channel is in Schottky contact with the first metal source 4a.

(2) The gate structure may be either an MIS gate structure or a gate structure with a p-type GaN cap layer.

The present invention will be described below in detail in combination with the accompanying drawings.

Embodiment 1

A heterojunction semiconductor device having a high blocking capability includes: a substrate 1; a first channel layer 2 is disposed on the substrate 1; a second channel layer 5, a metal drain 8 and a second metal source 4b are arranged on the first channel layer 2; a second barrier layer 6 is disposed on the second channel layer 5 and a second channel 5a is formed; the metal drain 8 and the second metal source 4b are respectively located on two sides of the second channel layer 5 and the second barrier layer 6; a trench gate structure is disposed in the second barrier layer 6; the trench gate structure is embedded into the second barrier layer 6 and is composed of a gate medium 9 and a gate metal 10 located in the gate medium 9; an isolation layer 7 is disposed in the second channel layer 5 and separates the second channel layer 5 into an upper layer and a lower layer; a first barrier layer 3 is disposed on the first channel layer and a first channel 2a is formed; a third channel layer 11 and a third barrier layer 12 are disposed between the lower layer of the second channel layer 5 and the first barrier layer 3 and a third channel 11a is formed; a bottom of the metal drain 8 is flush with a bottom of the first barrier layer 3; a first metal source 4a is disposed between the second metal source 4b and the first channel layer 2; the first metal source 4a is in Schottky contact with the first channel 2a; the first metal source 4a is in Schottky contact with the third channel 11a; and the second metal source 4b is in ohmic contact with the second channel 5a.

In the embodiment, when the device works in the reverse blocking state, the two-dimensional electron gas in the first channel and the third channel is depleted and reduced, the space-charge region in the vicinity of the first source can further expand to be under the gate compared with the single channel, and the two-dimensional electron gas close to the source region and under the gate is further reduced. At this time, the electrons reaching the drain are less, the off-state leakage current smaller and the breakdown voltage is higher. When the device works in the reverse current discharge state, both the first channel and the third channel discharge these current at the same time, thereby enhancing the current discharge capability of the device, and further improving the stability of the device and the circuit.

Embodiment 2

A heterojunction semiconductor device having a high blocking capability includes: a substrate 1; a first channel layer 2 is disposed on the substrate 1; a second channel layer 5, a metal drain 8 and a second metal source 4b are arranged on the first channel layer 2; a second barrier layer 6 is disposed on the second channel layer 5 and a second channel 5a is formed; the metal drain 8 and the second metal source 4b are respectively located on two sides of the second channel layer 5 and the second barrier layer 6; a p-type GaN cap layer 9 and a gate metal 10 are arranged on an upper surface of the second barrier layer 6; an isolation layer 7 is disposed in the second channel layer 5 and separates the second channel layer 5 into an upper layer and a lower layer; a first barrier layer 3 is disposed between the lower layer of the second channel layer 5 and the first channel layer 2 and a first channel 2a is formed; a bottom of the metal drain 8 is flush with a bottom of the first barrier layer 3; a first metal source 4a is disposed between the second metal source 4b and the first channel layer 2; the first metal source 4a is in Schottky contact with the first channel 2a; and the second metal source 4b is in ohmic contact with the second channel 5a.

In the embodiment, the GaN heterojunction takes the AlGaN/GaN as an example. Highly concentrated two-dimensional electron gas is formed on the heterojunction interface due to the polarization effect, and the two-dimensional electron gas serves as a current transport channel of the device. Generally, the HEMT device is a depletion type device because the source and the drain are in ohmic contact and the two-dimensional electron gas channel is normally open. The present invention designs the gate structure with the p-type GaN cap layer, and forms the enhanced device by the use of the reverse blocking capability of the Schottky contact. By boosting the grid voltage, the semiconductor in the grid medium forms strong inversion to implement current conduction.

The present invention is prepared with the following method:

Step 1: the first channel layer 2, the first barrier layer 3, the second channel layer 5, the isolation layer 7 and the second barrier layer 6 are sequentially grown on the surface of the substrate 1 by a deposition process.

Step 2: deep trenches are etched by a photoetching process on two ends of the second channel layer 5 till the upper surface of the first channel layer 2; and the upper surface of the second barrier layer 6 is etched to form the trench gate structure.

Step 3: the gate medium 9 is formed in the trench gate structure on the upper surface of the second barrier layer 6 by the deposition process.

Step 4: a metal layer is deposited on the surface of the device by the deposition and etching processes, extraction electrodes in an electrode contact region are etched to form the first source metal 4a, the second source metal 4b, the drain metal 8 and the gate metal 10, and at last, the passivating treatment is carried out.

What is claimed is:

1. A heterojunction semiconductor device having a high blocking capability, comprising: a substrate (1), wherein a first channel layer (2) is disposed on the substrate (1); a second channel layer (5), a metal drain (8) and a second metal source (4b) are arranged on the first channel layer (2); a second barrier layer (6) is disposed on the second channel layer (5) and a second channel (5a) is formed; the metal drain (8) and the second metal source (4b) are respectively located on two sides of the second channel layer (5) and the second barrier layer (6); a trench gate structure is disposed in the second barrier layer (6); the trench gate structure is embedded into the second barrier layer (6) and is composed of a gate medium (9) and a gate metal (10) located in the gate medium (9); an isolation layer (7) is disposed in the second channel layer (5) and separates the second channel layer (5) into an upper layer and a lower layer; a first barrier layer (3) is disposed between the lower layer of the second channel layer (5) and the first channel layer (2) and a first channel (2a) is formed; a bottom of the metal drain (8) is flush with a bottom of the first barrier layer (3); and a first metal source (4a) is disposed between the second metal source (4b) and the first channel layer (2).

2. The heterojunction semiconductor device having the high blocking capability according to claim 1, wherein the first metal source (4a) is in Schottky contact with the first channel (2a), and the second metal source (4b) is in ohmic contact with the second channel (5a).

3. The heterojunction semiconductor device having the high blocking capability according to claim 1, wherein a distance from a bottom of the isolation layer (7) to a top of the first barrier layer (3) is not less than 0.1 μm.

4. The heterojunction semiconductor device having the high blocking capability according to claim 3, wherein a group of channel layer (11) and barrier layer (12) that are laminated to each other is at least disposed between the lower layer of the second channel layer (5) and the first barrier layer (3), and a current channel is formed between the channel layer (11) and the barrier layer (12).

5. The heterojunction semiconductor device having the high blocking capability according to claim 3, wherein the current channel between the channel layer (11) and barrier layer (12) that are laminated to each other is in Schottky contact with the first metal source (4*a*).

* * * * *